US008866504B2

(12) United States Patent
Eckert et al.

(10) Patent No.: US 8,866,504 B2
(45) Date of Patent: Oct. 21, 2014

(54) DETERMINING LOCAL VOLTAGE IN AN ELECTRONIC SYSTEM

(75) Inventors: Martin Eckert, Boeblingen (DE); Roland Frech, Ostfildern (DE); Otto Torreiter, Boeblingen (DE); Dieter Wendel, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 428 days.

(21) Appl. No.: 13/280,626

(22) Filed: Oct. 25, 2011

(65) Prior Publication Data
US 2012/0146674 A1    Jun. 14, 2012

(30) Foreign Application Priority Data
Dec. 13, 2010   (EP) .................................... 10194676

(51) Int. Cl.
*G01R 31/3187*   (2006.01)
*G01R 31/317*    (2006.01)
(52) U.S. Cl.
CPC ...... *G01R 31/3187* (2013.01); *G01R 31/31703* (2013.01)
USPC ...................................................... 324/750.3
(58) Field of Classification Search
CPC ........... G01R 31/2884; G01R 31/2834; G01R 31/3172; G01R 31/3187
See application file for complete search history.

(56) References Cited

U.S. PATENT DOCUMENTS

| 5,912,901 | A  | * | 6/1999  | Adams et al. ................ 714/733 |
| 7,355,429 | B2 | * | 4/2008  | Jenkins et al. ............ 324/750.3 |
| 7,405,586 | B2 | * | 7/2008  | Gupta et al. ............ 324/762.01 |
| 2003/0052331 | A1 |  | 3/2003 | Gauthier et al. |
| 2004/0128115 | A1 |  | 7/2004 | Chen et al. |
| 2008/0249727 | A1 |  | 10/2008 | Takase |
| 2009/0072810 | A1 |  | 3/2009 | Lee et al. |
| 2010/0109700 | A1 |  | 5/2010 | Ferraiolo et al. |
| 2010/0176873 | A1 |  | 7/2010 | Lee et al. |

FOREIGN PATENT DOCUMENTS

WO   WO2006119303 A2   11/2006

* cited by examiner

*Primary Examiner* — Tung X Nguyen
(74) *Attorney, Agent, or Firm* — Margaret McNamara, Esq.; Kevin P. Radigan, Esq.; Heslin Rothenberg Farley & Mesiti P.C.

(57) ABSTRACT

A system for measuring a test voltage level ($V_x$) in a location within a chip is presented. The system includes an on-chip measurement device with an on-chip comparator and an on-chip storage. The on-chip comparator is configured for comparing the test voltage ($V_x$) to be measured to a reference voltage ($V_{ref}$), while the on-chip storage is configured for storing the result of this comparison. The system also includes external (off-chip) equipment for generating the reference voltage ($V_{ref}$), for generating probe signals for probing the state of the storage and for retrieving the state of said on-chip storage.

14 Claims, 6 Drawing Sheets

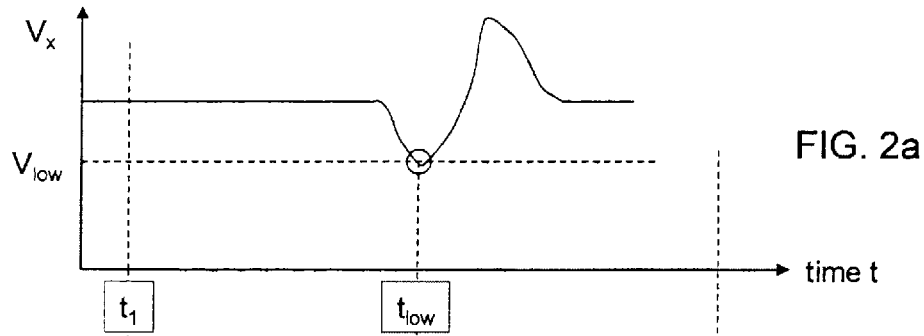
FIG. 2a
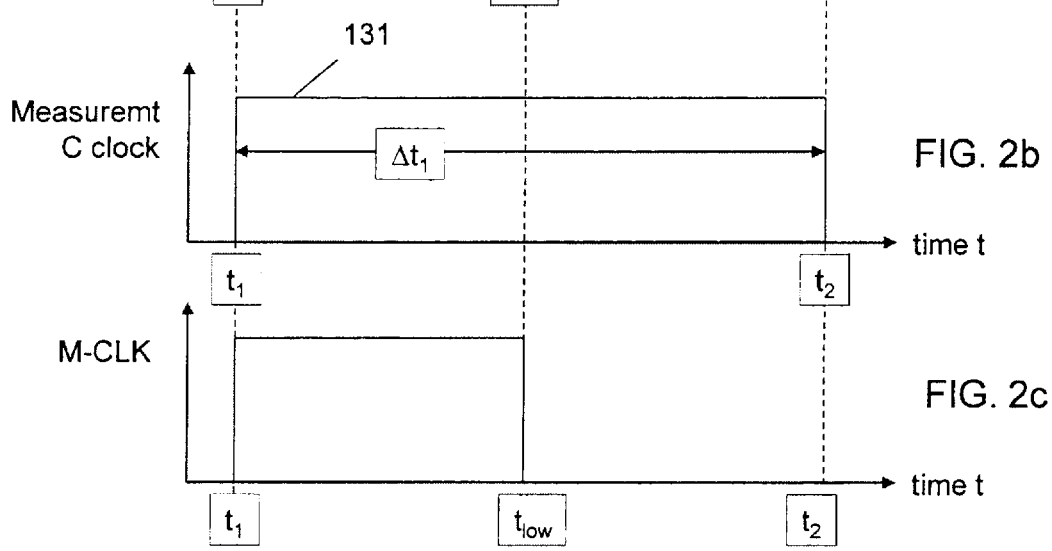
FIG. 2b
FIG. 2c
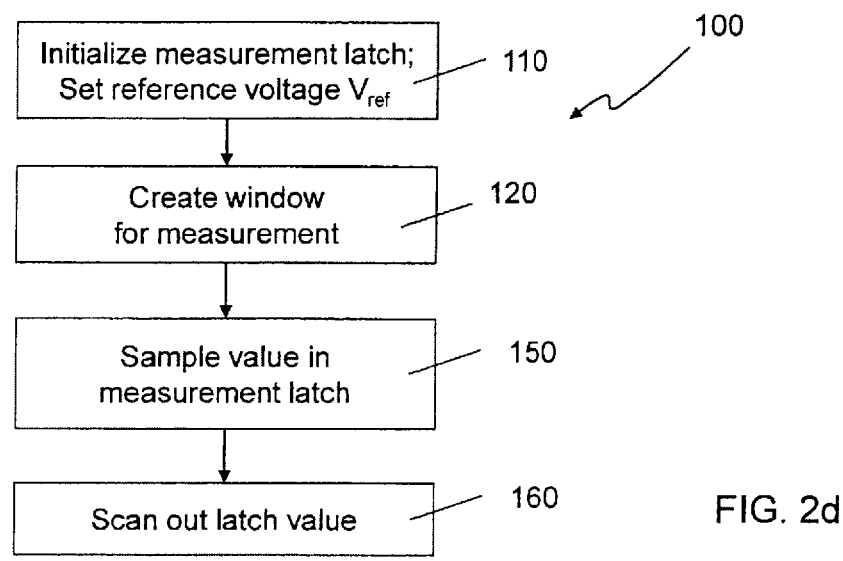
FIG. 2d

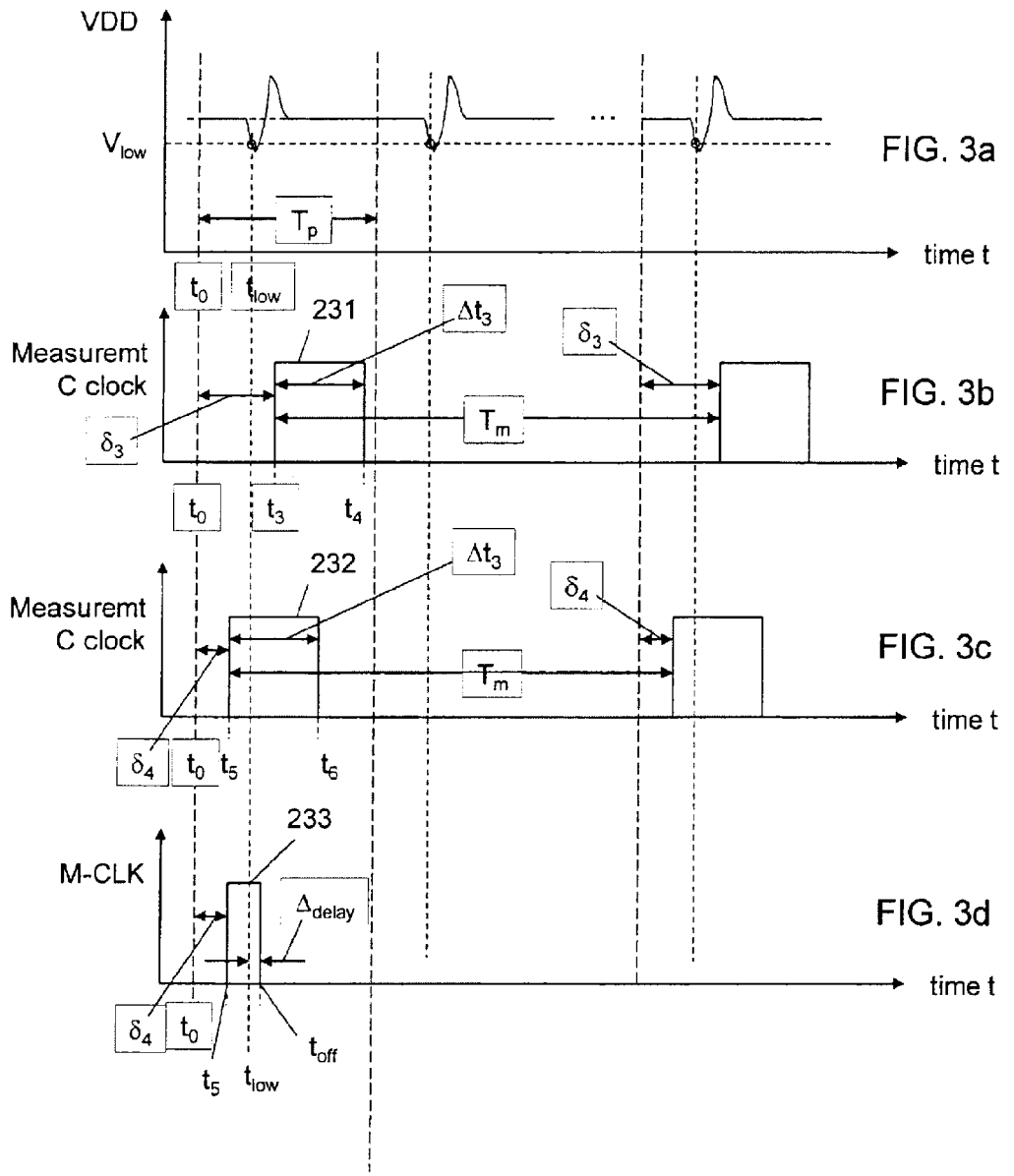

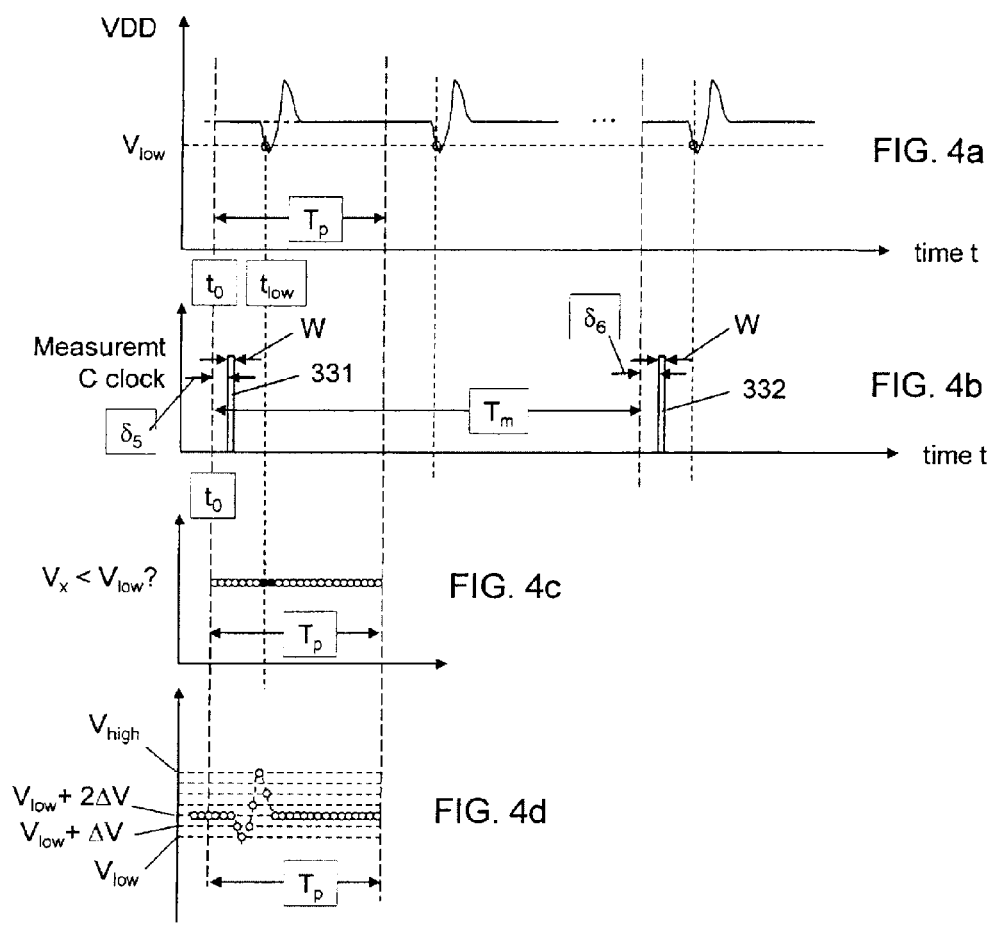

DETERMINING LOCAL VOLTAGE IN AN ELECTRONIC SYSTEM

PRIOR FOREIGN APPLICATION

This application claims priority from European patent application number 10194676.2, filed Dec. 13, 2010, which is hereby incorporated herein by reference in its entirety.

BACKGROUND

The invention relates generally to integrated circuits and in particular to a system and a method for determining voltage in a specified location in an integrated circuit chip. Specifically, the invention relates to a voltage measurement system comprising an on-chip voltage measurement device as well as off-chip equipment for generating a reference voltage and probing signals.

Modern high-end integrated circuits (ICs) are known to require constant voltage levels as well as precise and stable clock signals in order to ensure IC functionality. Therefore, supply voltage levels and waveforms, clock shapes etc. are critical items in these high end electronic designs which need to fulfill ambitious requirements with respect to reliability and robustness. As a consequence, voltage drop analysis, voltage stability analysis, clock shape analysis etc. play an important role for the verification and characterization of VLSI chips, especially in devices operating at high clock grid frequencies. In these integrated circuits, an appropriate interpretation of test chip measurements requires an exact knowledge of local voltage and clock levels at various locations within the design. Thus, there is a need for a methodology that is able to verify local voltage levels (e.g. of supply voltage, clock signals etc.) during early VLSI tests, first module tests as well as final compound operation in system environment.

Traditional supply voltage measurement of integrated circuits is performed outside of the chip and makes use of sense lines to bring on-chip signals off the chip for measurement. Once the voltage being tested has been taken off-chip through the chip's I/O pad, this voltage may then be measured using an oscilloscope or multimeter. In order to perform this kind of measurement, however, sense lines need to be physically attached to their pin assignments and therefore reduce the number of free pins available as I/O ports of the chip under consideration. Therefore, this kind of voltage measurement consumes I/O capability and is cost intensive (or not available) when required at multiple locations within a chip. Moreover, as the voltage is taken off-chip, the chip's package may introduce parasitic effects such as parasitic capacitance. If the voltage to be tested is of high impedance, the integrity of the signal may not be able to withstand the parasitic effects of the I/O ports and the package, so that the voltage cannot be measured accurately with an external oscilloscope of multimeter.

The impedance issue may be overcome by means of a driver (such as an amplifier). The amplified signal is taken off-chip via the chip's I/O ports and package and fed into an oscilloscope or multimeter for analysis. While this arrangement allows measurement of on-chip voltage signals, there is still the problem of noise and losses originating from the I/O pad and chip package.

It is also possible to implement on-chip A/D converters which enable on-chip measurement of analog voltages: The A/D converter translates the analog voltage level to a digital value based on a conversion with respect to a reference voltage, and the digital value is stored in logic located on the chip. While the use of on-chip A/D converters increases measurement accuracy since the analog signal is not taken off the chip, it is costly because it requires extra logic (and thus silicon area) and adds complexity to the system. In an effort to overcome this problem, International Publication No. WO2006/119303A2, entitled "Apparatus and Methods for Measurement of Analog Voltages in an Integrated Circuit," Fung et al., published Nov. 9, 2006, which is hereby incorporated herein by reference in its entirety, discloses an on-chip measurement device which comprises a D/A converter for generating an analog voltage and a comparator for comparing this analog voltage to a reference voltage provided on-chip. The output of the comparator is fed into a sequential logic. The measurement device described in WO 2006/119303 A2 may be capable of accurate on-chip voltage level measurements, but it does not allow measurements with a high time resolution which are needed for assessing noise associated with certain activities executing within the chip and/or clock signal properties.

U.S. Publication No. 2009/0072810A1, entitled "Voltage-Drop Measuring Circuit, Semiconductor Device and System Having the Same, and Associated Methods," Lee et al., published Mar. 19, 2009, which is hereby incorporated herein by reference in its entirety, discloses an on-chip voltage-drop measuring circuit which is capable of measuring a voltage drop caused by a shunt resistance component as part of a power line. The voltage-drop measuring circuit comprises a sensing circuit with sensors configured to generate a sensing voltage received by the sensor from a power pad through a power line between the sensor and the power pad. While this measuring circuit may be capable of detecting power drops within the chip, it generates the reference voltage from the VDD supply voltage of the chip and thus influences voltage levels within the chip. Moreover, the measuring circuit does not provide the high temporal resolution required to analyze local VDD noise of clock shapes.

U.S. Publication No. 2010/0109700A1, entitled "On-Chip Detection of Power Supply Vulnerabilities," Ferraiolo et al., published May 6, 2010, which is hereby incorporated herein by reference in its entirety, describes an on-chip sensor for detecting power supply vulnerabilities. The on-chip sensor employs a sensitive delay chain and an insensitive delay chain to detect power supply undershoots and overshoots without requiring off-chip components.

U.S. Publication No. 2003/0052331A1, entitled "Analog-Based Mechanism for Determining Voltage," Gauthier et al., published Mar. 20, 2003, which is hereby incorporated herein by reference in its entirety, shows an on-chip voltage sensor geared at selectively eliminating noise from a voltage measurement. The on-chip voltage sensor has resistive and capacitive components in the voltage divider, thus allowing a voltage on a section of the chip to be measured exclusive of high-frequency noise Additional on-chip devices for measuring voltage in an integrated circuit chip are disclosed in U.S. Publication No. 2008/0249727A1, entitled "Systems and Methods for Determining Variations in Voltages Applied to an Integrated Circuit Chip," Takase, published Oct. 9, 2008; U.S. Publication No. 2010/0176873A1, entitled "Internal Voltage Generator for Semiconductor Integrated Circuit Capable of Compensating for Change in Voltage Level," Jul. 15, 2010, published Jul. 15, 2010; U.S. Publication No. 2004/0128115A1, entitled "Hierarchical Power Supply Noise Monitoring Device and System for Very Large Scale Integrated Circuits," Chen et al., published Jul. 1, 2004; and U.S. Pat. No. 7,355,429B2, entitled "On-Chip Power Supply Noise Detector," Jenkins et al., issued Apr. 8, 2008, each of which is hereby incorporated herein by reference in its entirety.

While the devices described are capable of voltage measurement within the chip under consideration, there is still a need for a simple and efficient methodology for accurate high-speed voltage measurements within an integrated circuit. In particular, the methodology should be capable of yielding supply voltage and clock shape measurements; more generally, the methodology should enable high-speed measurements of time domain voltage waveforms within the chip. Moreover, this methodology should require as little chip resources (such as chip area, chip input and output ports) as possible.

BRIEF SUMMARY

According to one aspect of the present invention, a system for determining a test voltage level in a location within a chip is provided. The system comprises an on-chip measurement device with an on-chip comparator and an on-chip storage, where the on-chip comparator is configured for comparing said test voltage level to a reference voltage, and said on-chip storage is configured for storing the result of said comparison. The system also comprises external (off-chip) equipment for generating said reference voltage, for generating probe signals for probing the state of said storage and for retrieving the state of said storage. The measurement system is thus configured as a divided system comprising on-chip components as well as external components, such that measurement features which are sensitive to the voltage level are integrated into the chip (thus minimizing the chip area reserved for voltage measurement), while off-chip equipment is used for generating and shaping measurement signals which are used for probing the state of the on-chip storage which is fed by the on-chip comparator.

According to another aspect of the present invention, a method for measuring a test voltage level in a specific location within an integrated circuit is provided. The method makes use of an on-chip measurement device comprising a digital comparator and a storage. The method comprises (1) providing the test voltage to be measured and an on-chip reference voltage to the inputs of said comparator, (2) storing a change of state of said comparator in said storage and (3) after a predetermined measurement time window, retrieving the state of said storage. While the comparison and storage steps are carried out in on-chip device, the retrieving the state of the storage is performed using off-chip equipment. Thus, the method makes very efficient use of measurement capabilities integrated into the chip and of measurement equipment located outside.

The method may be used for detecting voltage drops and/or voltage rises in specific locations within the chip. The state of the storage is locked by using a probe signal which is provided by off-chip equipment and which may be a window pulse or a pulse strobe. By varying the level of the reference voltage, temporal variations of the test voltage—as, for example, caused by a periodic activity within the chip under test—may be traced out in detail.

BRIEF DESCRIPTION OF THE SEVERAL VIEWS OF THE DRAWINGS

The present invention together with the above-mentioned and other objects and advantages may best be understood from the following detailed description of the embodiments, but not restricted to the embodiments, wherein is shown in:

FIG. 2a is a diagram of a test voltage at a given location within the chip of FIG. 1, the test voltage exhibiting temporal variations (e.g. noise);

FIG. 2b is a diagram of a probe signal in the shape of a window pulse applied to AND gate 28 in the measurement device of FIG. 1 as used for detecting drops in the test voltage of FIG. 2a;

FIG. 2c is a diagram of the probe signal of FIG. 2b after passing AND gate 28;

FIG. 2d is a schematic flow diagram of a method for determining voltage drops or rises using the probe signal of FIG. 2b;

FIG. 3a is a diagram of a test voltage exhibiting temporal variations caused by a periodic activity within the chip;

FIG. 3b is a diagram of a probe signal in the shape of a window pulse applied to AND gate 28 in the measurement device of FIG. 1 as used for detecting drops in the test voltage of FIG. 3a;

FIG. 3c is a diagram of the probe signal of FIG. 3b, but shifted by a delay;

FIG. 3d is a diagram of the probe signal of FIG. 3c after passing AND gate 28;

FIG. 4a is a diagram of a test voltage exhibiting temporal variations caused by a periodic activity within the chip;

FIG. 4b is a diagram of a probe signal in the shape of a strobe pulse applied to AND gate 28 in the measurement device of FIG. 1 as used for detecting drops in the test voltage of FIG. 4a;

FIG. 4c is a schematic diagram of one period of the periodic activity, showing the incidents in which test voltage dropped below a threshold (reference) voltage;

FIG. 4d is a schematic diagram of a reconstruction of the test voltage curve of FIG. 4a.

Figure 1:
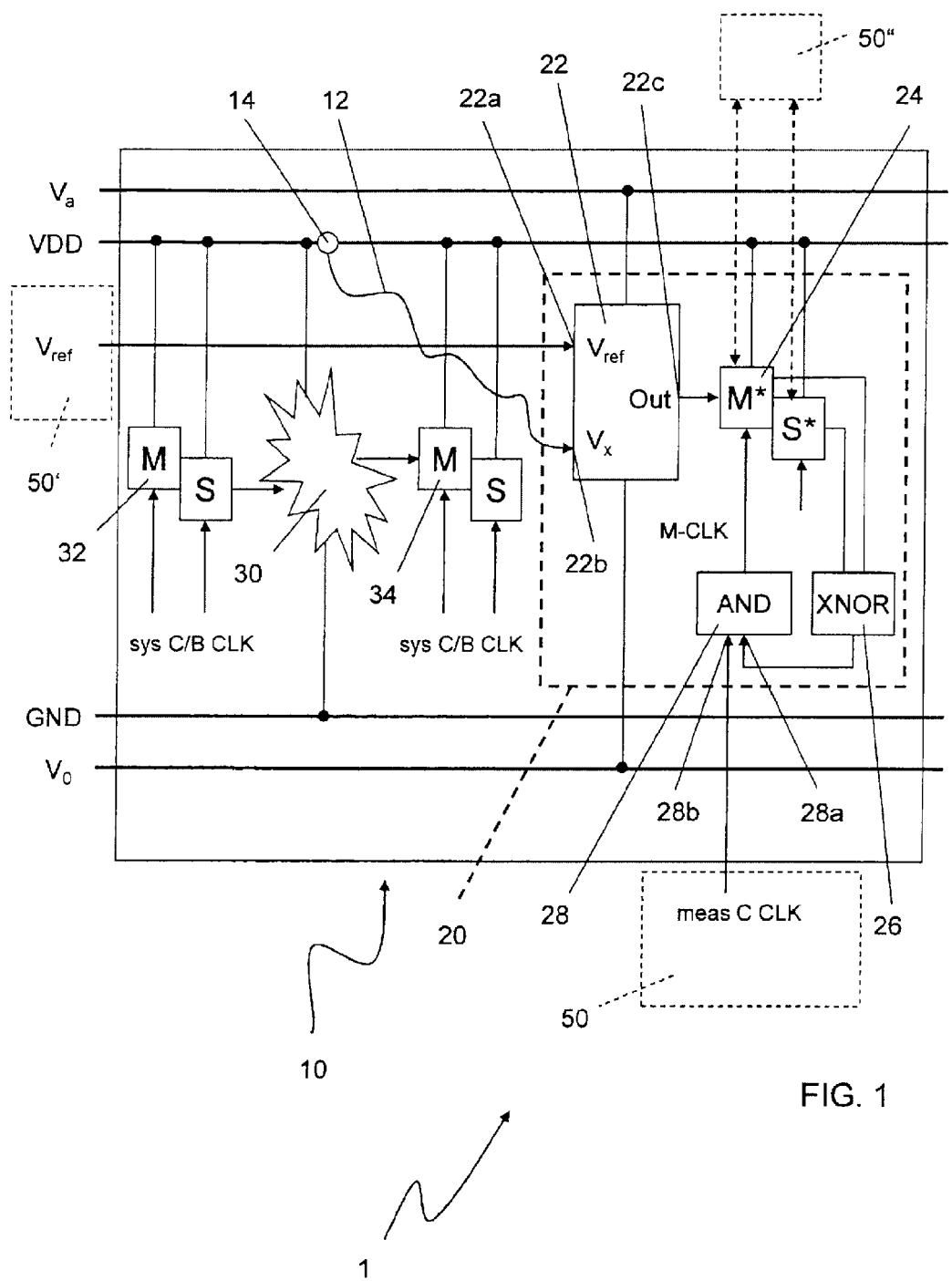
FIG. 1 is a schematic plan view of an electronic chip with an on-chip measurement device for determining voltage levels in a predetermined location within the chip.

In the drawings, like elements are referred to with equal reference numerals. The drawings are merely schematic representations, not intended to portray specific parameters of the invention. Moreover, the drawings are intended to depict only typical embodiments of the invention and therefore should not be considered as limiting the scope of the invention.

DETAILED DESCRIPTION

FIG. 1 displays a schematic plan view of a VLSI chip 10 comprising a logic block 30 with power supply lines VDD and GND. Logic block 30 is driven by a latch 32, and the output of logic block 30 is fed into another latch 34; each of these latches 32, 34 is clocked by a system clock. Generally, chip 10 will contain a large multitude of logic blocks. (Note that in the context of the present invention, the term "latch" is used as a synonym for a storage device (flip flop) inside an integrated circuit.)

During IC design and testing, it is often desirable to perform measurements of a test voltage in a specific location within chip 10. For example, it may be necessary to determine local supply voltage (VDD) level in physical chip 10 and to compare it to simulation results. Alternatively, it may be desirable to detect noise in local supply voltage (VDD) as specific activities are executed in chip 10. Alternatively, there may be a need to analyze clock signal shape in specific locations of chip 10.

In order to enable test voltage measurement in a predefined location 14 within VLSI chip 10, a measurement system 1 is provided. Measurement system 1 comprises, in one embodiment, an on-chip measurement device 20 integrated into chip 10 as well as external (off-chip) equipment 50, 50', 50" such as an oscilloscope (see FIG. 1). On-chip measurement device 20 is connected to a power lead 12 at location 14 and is configured to compare the test voltage $V_x$ level in location 14 to a reference voltage $V_{ref}$ and to store the result of this comparison. In particular, on-chip measurement device 20 comprises an on-chip comparator 22 for comparing test voltage $V_x$ to reference voltage $V_{ref}$, as well as a storage 24 for storing the result of the comparison. Reference voltage $V_{ref}$ is supplied by an external power supply 50' (which may be part of an external measurement/analysis equipment 50).

In the embodiment of FIG. 1, on-chip (digital) test voltage $V_x$ at location 14 and reference voltage $V_{ref}$ are fed into inputs 22a, 22b of comparator 22, and comparator 22 outputs a signal according to the result of this comparison such that:
comparator output=1 if $V_x \geq V_{ref}$, and
comparator output=0 if $V_x < V_{ref}$.

Reference voltage $V_{ref}$ thus represents a specific logic switch level for comparator 22 so that comparator 22 is switched on whenever the test voltage $V_x$ exceeds $V_{ref}$ and is switched off otherwise.

Note that comparator 22 is supplied by a voltage supply $V_a$, $V_0$ which is separate from the digital power supply VDD, GND of the logic within chip 10; thus, on-chip measurement device 20 is disjoined from the power supply VDD, GND of the logic under consideration. In one embodiment, supply voltage $V_a$ of comparator 20 is larger than the chip supply voltage VDD.

The output 22c of comparator 22 is connected to a measurement latch 24 which stores the result of the comparison and which may be read out by external measurement/analysis equipment 50 using a suitable routine. Measurement latch 24 comprises a master bit M* and a slave bit S*, the contents of which are fed into input pins of an XNOR gate 26. The output of XNOR gate 26 is connected to an AND gate 28 together with the periodic signal of a measurement C-clock provided by measurement/analysis equipment 50 outside chip 10. If M* bit and S* bit of measurement latch 24 contain identical values (both 1 or both 0), AND gate 28 will be transparent, so that the signal of measurement C clock applied to on-chip measurement device 20 from external measurement/analysis equipment 50 will be propagated through AND gate 28, and AND gate 28 will output a M-CLK signal which is identical to measurement C clock signal. If, on the other hand, M* bit and S* bit of measurement latch 24 contain different values, XNOR gate 26 will switch off AND gate 28 which in turn will cut off M-CLK signal. Since M-CLK signal drives measurement latch 24, a cutoff of M-CLK signal will effectively freeze the present state of measurement latch 24.

As measurement C clock signal is provided by external measurement/analysis equipment 50 outside chip 10, measurement C clock signal may be adapted to the specific measurement situation:

In one embodiment, on-chip measurement device 20 is used for detecting occurrences in which test voltage $V_x$ (e.g supply voltage VDD) in a predetermined location 14 drops below a threshold $V_{low}$. This may be used for determining whether certain activities executing in chip 10 are associated with (undesired) decreases of supply voltage VDD in location 14. FIG. 2a shows an example of test voltage $V_x$ in location 14 as a function of time. $V_x$ is seen to display noise which causes $V_x$ to drop below threshold $V_{low}$ at a time $t_{low}$. A method 100 for detecting this kind of voltage drops by making use of on-chip measurement device 20 is outlined in FIG. 2d. Location 14 in which test voltage $V_x$ is to be measured is connected to input 22a of comparator 22 by means of a connection 12.

At the outset of method 100, measurement latch 24 is initialized by setting both M* bit and S* bit high (=1), and the desired threshold voltage $V_{low}$ is applied to input 22a of comparator 22 (so that $V_{ref}=V_{low}$) (step 110). Subsequently, at a time $t_1$ a measurement C clock signal in the shape of a window strobe 131 of duration $\Delta t_1$ is generated in external measurement/analysis equipment 50 and applied to input 28b of AND gate 28 within on-chip measurement device 20 (step 120). As shown in FIG. 2b, measurement C clock signal constitutes a constant level beginning at time $t_1$ and ending at time $t_2$.

As long as the voltage $V_x$ in location 14 is larger than $V_{low}$, comparator 22 output 22c is high (=1), so that the M* bit of measurement latch 24 remains in its initial state (i.e. at the same value as the S* bit). In this state, the output of XNOR gate 24 is equal to one, so that AND gate 28 is transparent. This means that M-CLK signal is identical to measurement C clock signal. At time $t_x$ voltage $V_x$ is sent to drop below threshold value $V_{low}$ so that comparator 22 output 22c changes to low (=0), and M* bit of measurement latch 24 changes state. This causes XNOR gate 26 to make AND gate 28 opaque, so that M-CLK signal is switched off (see FIG. 2c) and the state of measurement latch 24 is frozen (step 150).

After the end $t_2$ of measurement window corresponding to measurement C clock signal, the data stored in measurement latch 24 are scanned out (step 160) into off-chip equipment 50" where a further analysis of the measurement data may be carried out. The values of M* and S* are indicative of whether or not a test voltage drop below $V_{low}$ occurred in time interval $t_2-t_1$: If the values stored in M* and S* are identical, no voltage drop occurred. If, on the other hand, the values stored in M* and S* differ, a voltage drop occurred (as in the example shown in FIG. 2a-2c). By using the method 100 shown in FIG. 2d, a test voltage drop may be detected in location 14.

Method 100 may be used as a long term noise detector: in this application, latch 24 is initialized as described above and measurement clock is set to a long duration $\Delta t_1$ during which an activity is executed in chip 10. After duration $\Delta t_1$ the state of latch 24 may be probed in order to find out whether the activity caused a noise event which triggered the on-chip measurement device 20.

Note that method 100 will not discriminate between a single event test voltage drop and multiple voltage drops. Moreover, method 100 cannot yield information on the exact time $t_{low}$ at which the test voltage drop occurred and cannot correlate the occurrence of the voltage drop to ongoing activities within chip 10.

Figure 3E:
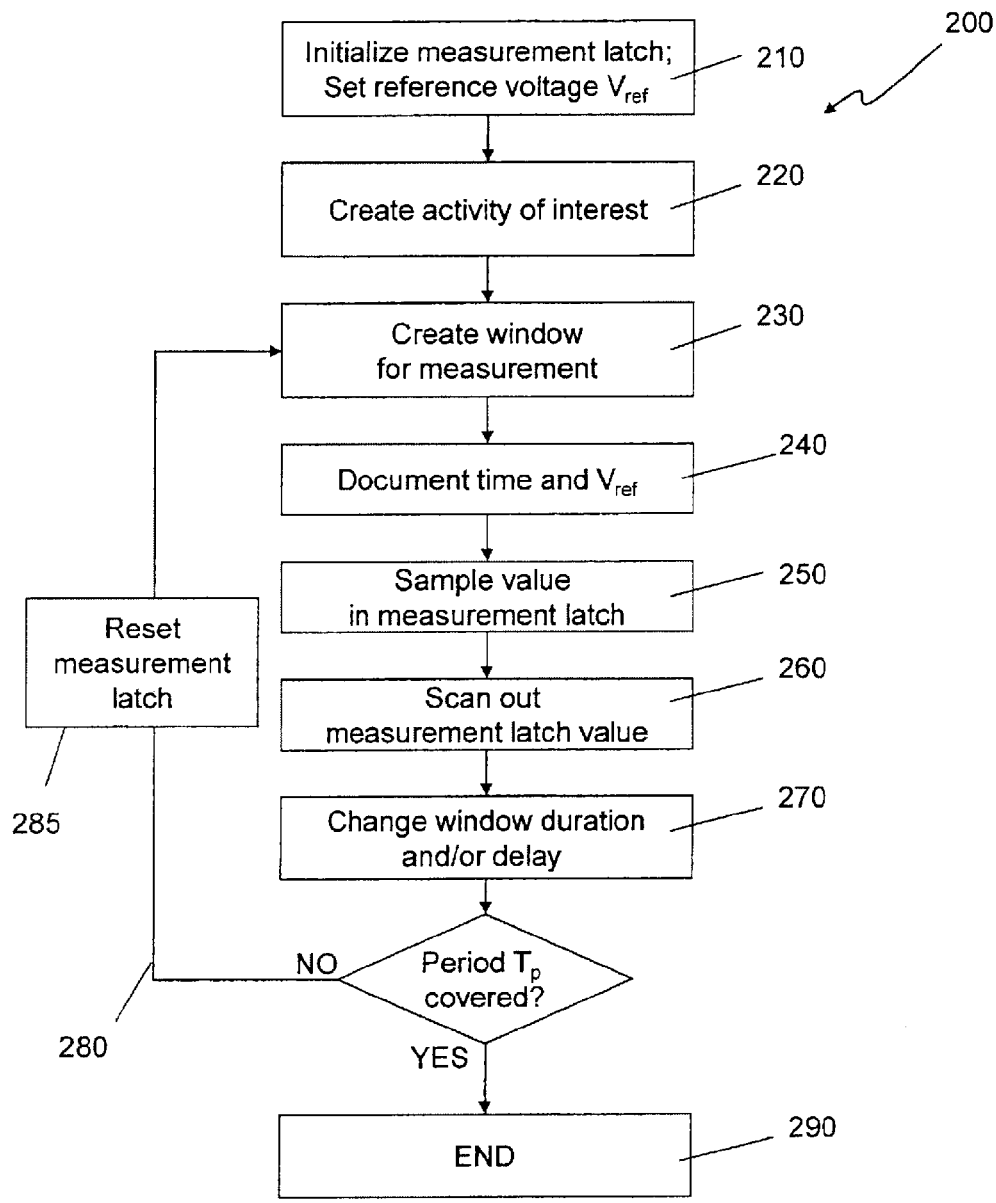
FIG. 3e is a schematic flow diagram of a method for determining voltage drops or rises using the probe signal of FIGS. 3b, 3c.

A method 200 for (further) investigating and for quantifying the occurrence of test voltage drops with respect to a specific activity within chip 10 is depicted in the flow diagram of FIG. 3e. In this methodology, the periodic activity (e.g. a set of instructions executing in logic block 30) is applied repeatedly to chip 10, and a variety of window strobes of different duration is fed into input 28b of AND gate 28 for capturing voltage drop events.

At the outset of method 200, measurement latch 22 is initialized by setting both M* bit and S* bit high (=1), and the desired threshold voltage $V_{low}$ is applied to input 22a of comparator 22 (so that $V_{ref}=V_{low}$) (step 210). Subsequently, the activity is periodically executed in chip 10. This periodic activity may influence VDD supply voltage level $V_x$ at location 14 and thus may cause VDD supply voltage to temporarily drop below threshold voltage $V_{low}$. FIG. 3a shows a diagram of the time dependence of local VDD supply voltage $V_x$ in location 14 which exhibits noise associated with a periodic activity of period $T_p$, causing local VDD voltage to periodically drop below threshold voltage $V_{low}$.

It is desirable to determine the exact times $t_{low}$ at which these voltage drops occur and to correlate them with the periodic activity so that their origin may be traced back. This is done by iteratively inputting window strobes of varying duration and delay to AND gate 28 of on-chip measurement device 20.

To begin with, a measurement C clock signal 231 with a predefined measurement window is generated in external measurement/analysis equipment 50 and applied to input 28b of AND gate 28 in on-chip measurement device 20 (step 230). As an example, assume that this window strobe 231 has a duration of $\Delta t_3 = t_4 - t_3$ and a delay $\delta_3 = t_3 - t_0$ relative to the onset of periodic activity, as shown in FIG. 3b. Window strobe 231 is repeated periodically with a measurement period $T_m$ which is typically much larger than activity period $T_p$ ($T_m >> T_p$). Window strobe 231 of period $T_m$ is locked to the onset $t_0$ of periodic activity of period $T_p$ in such a way that the delay $\delta_3$ between the onset of window strobe 231 and the last occurrence of periodic activity is always the same. Window duration $\Delta t_3$ and delay $\delta 3$ of measurement C clock signal 231 are documented in step 240 together with the actual value of reference voltage $V_{ref} = V_{low}$. Probing on-chip measurement device 20 with measurement C clock signal 231 will furnish a measurement result which is stored in measurement latch 24 (step 250) and which is scanned out in step 260. In the case of a measurement C clock signal 231 as shown in FIG. 3b, voltage drop occurrences as shown in FIG. 3a cannot be captured since the capture window of measurement C clock signal 231 does not overlap with these voltage drops (i.e. time $t_{low}$ lies outside strobe window $t_4 - t_3$). While comparator 22 switches as soon as $V_x < V_{low}$, measurement C clock 231 is inactive at this precise moment and thus the switching event is not frozen in latch 24 but passes unnoticed. As a consequence, no changes of latch value are registered in step 250, and the readout of latch 24 (step 260) furnishes the information that VDD supply voltage $V_x$ at location 14 does not exhibit any voltage drops below $V_{low}$ within the capture window of duration $\Delta t_3 = t_4 - t_3$ at delay $\delta_3 = t_3 - t_0$ as shown in FIG. 3b.

In a next step 270, duration $\Delta t$ and/or delay 6 of the strobe window used as measurement C clock signal is modified. Both edges of the strobe window can be adjusted so that the window width and position can be varied. For example (see FIG. 3c), measurement C clock signal 232 may be modified to have a reduced delay $\delta_4 < \delta_3$ so that capture window is shifted towards event start $t_0$ (while its duration $\Delta t_3$ remains unchanged). As this measurement C clock signal 232 is applied to on-chip measurement device 20, AND gate 28 is transparent as long as test voltage $V_x \geq V_{low}$. However, once test voltage $V_x$ drops below $V_{low}$ at time $t_{low}$, AND gate 28 becomes opaque; FIG. 3d shows the corresponding M-CLK signal 233 output from AND gate 28 as a function of time. Note that M-CLK signal 233 does not immediately shut off at time $t_{low}$ as soon as $V_x < V_{low}$, but only after a delay $\Delta_{delay}$ which is the sum of delays of the signals crossing XNOR gate 26 and AND gate 28. Thus, when trying to exactly pinpoint the occurrence of the voltage drop, this delay $\Delta_{delay}$ has to be taken into account.

In the case of measurement C clock signal 232 as shown in FIG. 3b, the voltage drop event ($V_x < V_{low}$) occurs within the capture window of this measurement C clock signal 232. Thus, a value change is sampled in measurement latch 24 in step 250 which is scanned out in step 260. By iteratively repeating this procedure, the period $T_p$ of periodic activity in chip 10 may be covered (loop 280), for example by iteratively adjusting delay $\delta$ and reducing duration $\Delta t$ of measurement C clock signal until the exact onset $t_{low}$ and duration of voltage drop has been determined (step 290). Note that between iterations, measurement latch 24 has to be reset to its initial state (step 285) so that AND gate 28 is transparent.

Next to using a window strobe as measurement C clock signal for probing on-chip measurement device 20 (see FIG. 3b), it is also possible to use an edge strobe. An edge strobe is a special case of a window strobe in which a probe pulse with a very small pulse width W and a small step size S is used repeatedly. A methodology making use of a pulse strobe is illustrated in FIGS. 4a to 4e.

Figure 4E:
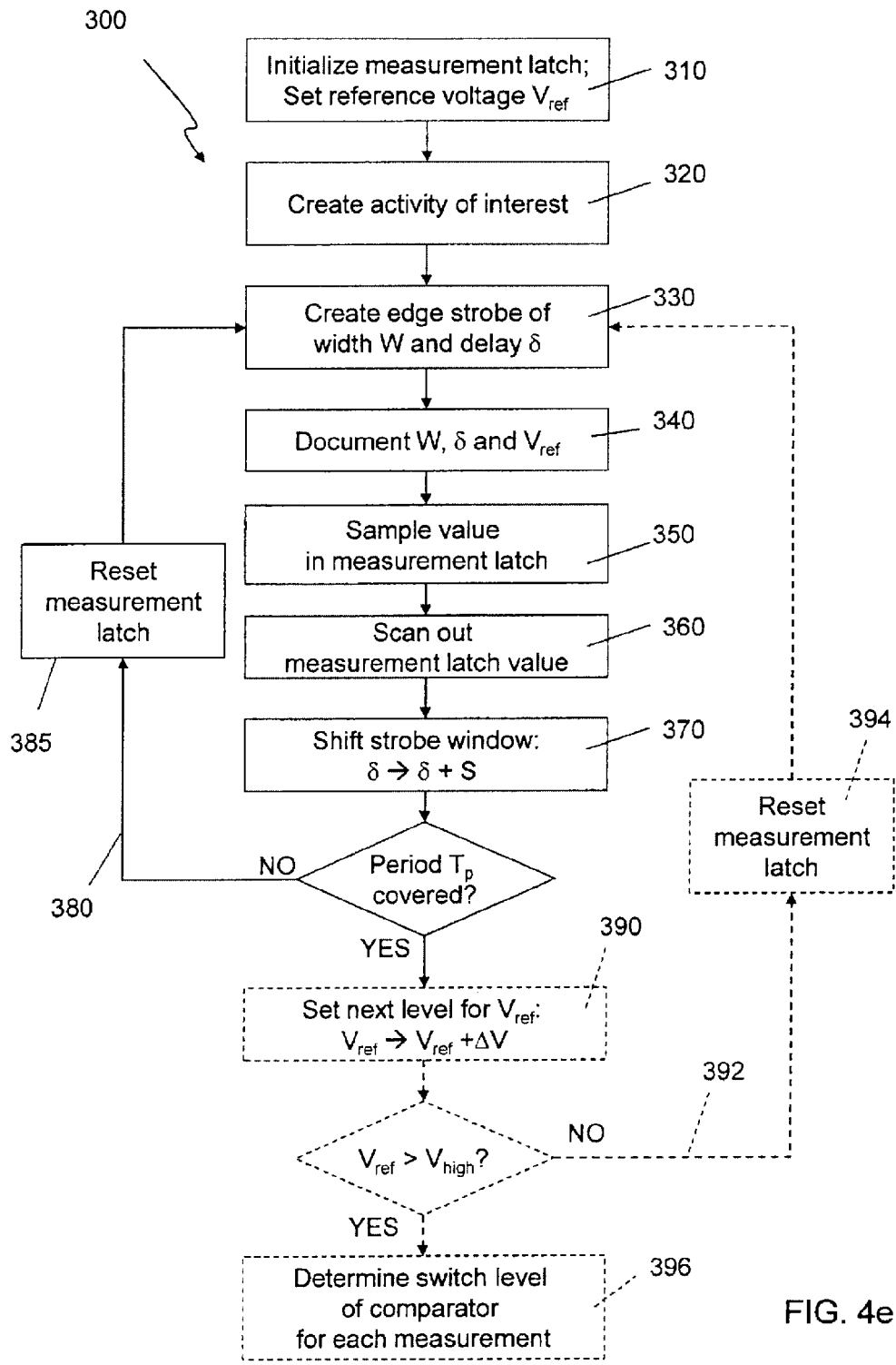
FIG. 4e is a schematic flow diagram of a method for determining drops in test voltage and test voltage shape using the strobe pulse of FIG. 4b as probe signal.

FIG. 4a again shows VDD supply voltage $V_x$ in location 14 on chip 10 as a function of time exhibiting noise due to a periodic activity of period $T_p$ executing in chip 10, and FIG. 4e depicts a flow diagram of a method 300 for analyzing voltage drops of test voltage $V_x$ using an edge strobe applied to on-chip measurement device 20. Method 300 begins by setting the voltage threshold $V_{ref} = V_{low}$ and initializing measurement latch 24 (step 310), as described above. Subsequently, the periodic activity of period $T_p$ is applied to logic block 30 within chip 10 (step 320). In step 330, an edge strobe 331 of width W and a delay $\delta$ relative to the starting time $t_0$ of the periodic activity is generated and applied to input 28b of AND gate 28 as a measurement C clock signal 331. Depending on whether this edge strobe coincides with a voltage drop or not, this edge strobe 331 will lead to a state change in measurement latch 24 (step 350) which is scanned out in step 360. Subsequently, edge strobe is shifted by a time interval S (step 370), measurement latch 24 is initialized again (step 385), and the new edge strobe (with delay $\delta + S$) is applied to AND gate 28. As an example, FIG. 4b shows a measurement C clock signal with an edge strobe 331 of width W which is applied at a delay $\delta_5$ relative to activity starting time $t_0$, and in the next measurement window (i.e. after measurement period $T_m$), an edge strobe 332 of width W which is applied at a larger delay $\delta_6 = (\delta_5 + S)$ after activity starting time $t_0$. Thus, the edge strobe is iteratively stepped through event period $T_p$ until the full event period is sampled (loop 380). Preferably, step size S is chosen to be the as close as possible to strobe width W, so that successive edge strobes cover event period $T_p$ with very high sampling rate. FIG. 4c shows the result of method 300 as applied to VDD supply voltage of FIG. 4a: Light bullets indicate instances for which $V_x$ is larger than $V_{low}$, whereas dark bullets indicate instances where $V_x$ is smaller than $V_{low}$, i.e. voltage drops below pre-determined threshold voltage $V_{low}$.

Method 300 may be extended and used for a quantitative measurement of the noisy voltage supply test signal $V_x$ in location 14, under functional conditions. This option is indicated with dotted boxes in flow diagram of FIG. 4e: Having completely scanned period $T_p$ by iteratively shifting edge strobe signal and determining time windows during which VDD supply voltage $V_x$ is smaller than reference voltage $V_{low}$, reference voltage may be shifted by a predetermined amount $\Delta V$ so that $V_{ref}$ is set to be $V_{ref} = V_{low} + \Delta V$ (step 390). Subsequently, measurement latch 24 is reset and loop 380 is reiterated, thus scanning period $T_p$ with strobe signal of width W and step size S as before, but with a higher reference voltage $V_{ref} = V_{low} + \Delta V$. This will yield regions within scanning period $T_p$ where $V_x$ is smaller than $V_{low} + \Delta V$, i.e. voltage drops below new threshold voltage $V_{low} + \Delta V$. By stepwise increasing threshold voltage $V_{ref}$ by multiples of $\Delta V$, this can be iterated until $V_{ref}$ has reached a maximum value of $V_{high}$ (loop 392). Once the whole voltage range [$V_{low}$, $V_{high}$] has been covered, the set of latch values sampled and scanned in steps 350, 360 for the various time delays δ within period $T_p$ and the various voltages $V_{ref}$ can be used to determine all switch levels (step 396) and can in particular be used for recreating signal curve $V_x$ as a function of time, as depicted in FIG. 4d. Thus, by analyzing the switch events of measurement latch 24, the signal curve VDD in location 14 on chip 10 can be recreated. This analysis will generally be carried out in a post process, e.g. in external measurement/analysis equipment 50 outside the chip 10.

Method 300 allows the determination of arbitrary voltage curves on the chip 10 without expensive high speed logic. While in the method 300 shown in flow diagram of FIG. 4e reference voltage $V_{ref}$ is initially set to a minimum value ($V_{ref}=V_{low}$) and is subsequently increased iteratively by adding voltage differentials $\Delta V$ until $V_{ref}$ has reached the maximum value $V_{high}$, reference voltage $V_{ref}$ may just as well initially be set to a maximum value ($V_{ref}=V_{high}$) and to iteratively be reduced by voltage differentials $\Delta V$ until it has reached the minimum value $V_{min}$. Also, loops 380 and 392 may be interchanged so that reference voltage $V_{ref}$ may be stepped through all values from $V_{low}$ to $V_{high}$ before the strobe window is shifted by a time interval S.

Note that method 200 (based on window strobe) may also be used by tracing out the time dependence of $V_x$ by adding a voltage loop (analogously to loop 392 of method 300). Thus, both window strobe and edge strobe are capable of furnishing the same information on voltages at arbitrary locations 14 within chip 10. Window strobe has the advantage that measurement window is held wide enough to reduce AC effects in a system which does not support high speed pulses (as may be found in cases where the chip under test is contacted with low cost probes/contacts). It also enables a faster detection of dedicated minimum or maximum values of the signal of interest.

Methods 100, 200 and 300 make use of an on-chip measurement device 20 which comprises comparator 22 and measurement latch 24 for storage. On-chip measurement device only contains a comparison functionality as well as a sample and hold functionality provided by measurement latch 24. The actual states stored in M* and S* bits of measurement latch 24 may be captured by separate clock wires with buffers; no clock wire grid is required.

Comparator voltage supply $V_a$, $V_0$ is disjoined from digital voltage supply VDD, GND of the chip 10 under test. Comparator voltages $V_a$, V0 may, for example, be supplied by external equipment (oscilloscope or multimeter) which is used for generating probe signals etc. Note that time-critical aspects of methods 100, 200 and 300—like the event trigger, the window and sample time—are deferred off-chip by using measurement/analysis equipment 50 which has a high accuracy and is generally available during IC testing. Thus, no expensive high-speed logic is required on chip 10. Since on-chip measurement device 20 is integrated into chip 10, measurement can be carried out in close proximity to the location of interest 14.

While FIG. 1 shows a chip 10 with only one on-chip measurement device, multiple instances can be implemented in order to investigate voltage behavior in different locations 14 on chip 10.

Note also that the analog reference voltage $V_{ref}$ which is used for setting the switch level of the comparator is generated outside chip 10. It is therefore independent of any chip activities, and its generation does not influence chip activities.

The methodology may be used for determining the behavior of any voltage on chip 10, such as supply voltage (e.g. for investigating power supply levels), voltage in signal leads (for verifying signal integrity), clock voltage (for measuring clock shape) etc.

The methodology does not require a real clock grid to be implemented; rather, it is sufficient to supply separate and simple clock wires with buffers for capturing clocks to capture latches.

Note from the above-description that the present invention provides a method for accurately detecting voltage drops and/or for determining voltage levels and their temporal variations within an integrated circuit chip. Moreover, it is an object of the invention to provide an on-chip measurement device which enables accurate voltage measurements while consuming a small amount of chip area.

These advantages are achieved by the features of the independent claims. The other claims, the drawings and the specification disclose advantageous embodiments of the invention.

What is claimed is:

1. A system for determining a test voltage level ($V_x$) in a location within a chip, comprising
an on-chip measurement device connected to the location within the chip having the test voltage level ($V_x$), the location being associated with one logic block of multiple logic blocks within the chip, the multiple logic blocks being separate from the on-chip measurement device, and the on-chip measurement device including an on-chip comparator and an on-chip storage, where the on-chip comparator is configured for comparing said test voltage level ($V_x$) to a reference voltage ($V_{ref}$), and said on-chip storage is configured for storing the result of said comparison, and
off-chip equipment for generating said reference voltage ($V_{ref}$), for generating probe signals for probing the state of said storage and for retrieving the state of said on-chip storage.

2. The system according to claim 1, wherein the off-chip equipment comprises means for adjusting the value of the reference supply voltage ($V_{ref}$).

3. The system according to claim 1, wherein the on-chip storage is a latch configured to change its state when the difference between test voltage ($V_x$) and reference voltage ($V_{ref}$) changes sign.

4. The system according to claim 3, wherein the on-chip measurement device comprises logic gates configured to save the state of the on-chip latch once the latch has undergone a change of state.

5. The system according to claim 1, wherein the on-chip comparator is fed by an analog voltage supply.

6. The system according to claim 4, wherein the off-chip equipment comprises means for instigating a periodic activity in a logic block within chip.

7. The system according to claim 1, wherein the on-chip measurement device comprises a gate configured to be transparent for the external probe signal while a latch is in an initial state and to become opaque once the latch undergoes a change of state.

8. A method of detecting a voltage level of a test voltage ($V_x$) in a location within an integrated circuit with an on-chip measurement device comprising a digital on-chip comparator and an on-chip storage, the method comprising;
providing the test voltage ($V_x$) at the location and an on-chip reference voltage ($V_{ref}$) to the inputs of said on-chip comparator, the location being associated with one logic block of multiple logic blocks within the chip, the multiple logic blocks being separate from the on-chip measurement device, storing a change of state of said on-chip comparator in said on-chip storage, after a predetermined measurement time window, retrieving the state of said on-chip storage.

9. The method of claim 8, further comprising providing an external probe signal to said on-chip measurement device which is used to save the present state of on-chip storage if on-chip storage experiences a state change.

10. The method of claim 9, wherein the external probe signal is a window strobe whose length corresponds to the measurement time window.

11. The method of claim 8, further comprising:

creating a periodic activity executing in a logic block within chip, repeatedly providing an external probe signal to said on-chip measurement device, said external probe signal causing storage to save its present state if the on-chip comparator experiences a state change.

12. The method according to claim 9, wherein the external probe signal is a window strobe whose length and/or delay relative to the periodic activity executing in the logic block is varied iteratively to cover the period of the periodic activity executing in the logic block.

13. The method according to claim 8, wherein the external probe signal is a edge strobe of constant length whose delay relative to the periodic activity executing in the logic block is varied iteratively to cover the period of the periodic activity executing in the logic block.

14. A method for measuring the time dependence of a test voltage ($V_x$) in a chip location within an integrated circuit while executing a periodic activity in a logic block within said integrated circuit, using an on-chip measurement device comprising a digital comparator and a storage, the method comprising:

creating a periodic activity executing in a logic block within the chip, repeatedly providing an external probe signal to said on-chip measurement device, said external probe signal causing storage to save its present state if the digital comparator experiences a state change, iteratively varying a reference voltage ($V_{ref}$) employed by the digital comparator between a minimum value ($V_{low}$) and a maximum value ($V_{high}$).

* * * * *